(12) United States Patent
DeShazo et al.

(10) Patent No.: US 6,741,500 B2
(45) Date of Patent: May 25, 2004

(54) ONE-TIME-PROGRAMMABLE BIT CELL WITH LATCH CIRCUIT HAVING SELECTIVELY PROGRAMMABLE FLOATING GATE TRANSISTORS

(75) Inventors: Daran DeShazo, Dallas, TX (US); Agustinus Sutandi, Murphy, TX (US); Jason Stevens, Plano, TX (US)

(73) Assignee: HPL Technologies, Inc., San Jose, CA (US)

( * ) Notice: Subject to any disclaimer, the term of this patent is extended or adjusted under 35 U.S.C. 154(b) by 18 days.

(21) Appl. No.: 10/264,756

(22) Filed: Oct. 4, 2002

(65) Prior Publication Data

US 2004/0066670 A1 Apr. 8, 2004

(51) Int. Cl.[7] .............................................. G11C 16/00
(52) U.S. Cl. .................. 365/185.28; 365/104; 365/154; 365/185.07
(58) Field of Search ....................... 365/185.28, 185.07, 365/154, 94, 104

(56) References Cited

U.S. PATENT DOCUMENTS

| | | | | | |
|---|---|---|---|---|---|
| 4,575,819 | A | * | 3/1986 | Amin | 365/104 |
| 4,695,979 | A | * | 9/1987 | Tuvell et al. | 365/185.1 |
| 5,956,269 | A | | 9/1999 | Ouyang et al. | 365/185.08 |
| 6,331,947 | B1 | * | 12/2001 | Widdershoven et al. | 365/185.08 |
| 6,342,807 | B1 | | 1/2002 | Nolan et al. | 327/525 |

* cited by examiner

Primary Examiner—Tan T. Nguyen
(74) Attorney, Agent, or Firm—Sierra Patent Group, Ltd.

(57) ABSTRACT

An OTP bit cell includes a latch circuit of cross-coupled inverters. A floating gate PMOS transistor is inserted in each of the inverters. One or the other of the floating gate PMOS transistors is programmed through an included programming circuit so that a differential output of the latch circuit provides a corresponding logic state that is the same each time when read. To program a selected floating gate PMOS transistor, appropriate write inputs are applied to the programming circuit while a high reference voltage to the OTP bit cell is raised to a level such that the selected floating gate PMOS transistor is programmed.

11 Claims, 3 Drawing Sheets

ONE-TIME-PROGRAMMABLE BIT CELL WITH LATCH CIRCUIT HAVING SELECTIVELY PROGRAMMABLE FLOATING GATE TRANSISTORS

FIELD OF THE INVENTION

The present invention generally relates to one-time-programmable ("OTP") bit cells and in particular, to an OTP bit cell with a latch circuit having selectively programmable floating gate transistors.

BACKGROUND OF THE INVENTION

OTP bit cells are commonly used for permanent or durable programming of bits in a system. OTP memory cells are a particularly popular type of OTP bit cell. OTP memory cells, however, are generally current sensing devices employing references and sense amplifiers. Therefore, they are prone to erroneous readings due to degradation of cell current over time. To avoid failure, or at least prolong the period of time before such failure, multiple OTP memory cells are sometimes placed in parallel to store a single bit of information. Although this arrangement may protect against charge loss from a single OTP memory cell causing a functional failure, the added OTP memory cells increase circuit size and consequently, device cost.

The use of latch circuits in OTP bit cells is advantageous, because they amplify current differences in generating differential voltage outputs rather than sensing current magnitudes. Consequently, latch circuits are not as readily prone to errors due to degradation of cell current, do not require the same reference and sense amplifier circuitry that OTP memory cells do, nor do they require the redundancy employed in OTP memory cells to reduce the effects of cell current degradation. Therefore, the use of latch circuits as OTP bit cells promise enhanced reliability and cost savings as compared to OTP memory cells.

OBJECTS AND SUMMARY OF THE INVENTION

Accordingly, an object of the present invention is to provide an OTP bit cell with a latch circuit that provides reliable and predictable results throughout its operational life.

Another object is to provide such an OTP bit cell that is cost effective to manufacture.

Still another object is to provide a method for programming such an OTP bit cell that is easy to perform in the field, as well as in the factory.

These and additional objects are accomplished by the various aspects of the present invention, wherein briefly stated, one aspect is an OTP bit cell including floating gate transistors, and transistors coupled to the floating gate transistors so as to act as a latch circuit. After one of the floating gate transistors is selectively programmed by increasing a voltage across its source and drain so as to reduce its threshold voltage, a current differential is generated through the floating gate transistors and consequently, a differential voltage output of the latch circuit results having a logic state that corresponds to that selection and is the same each time when read.

Another aspect is a method for programming an OTP bit cell including first and second floating gate transistors, first and second PMOS transistors, and first and second NMOS transistors coupled together and to high and low reference voltages so as to form a latch circuit, and third and fourth NMOS transistors coupled to the first and the second floating gate transistors, the method comprising: applying write input voltages to the third and fourth NMOS transistors while raising the high reference voltage so as to program one, but not the other of the first and the second floating gate transistors.

Additional objects, features and advantages of the various aspects of the invention will become apparent from the following description of its preferred embodiments, which description should be taken in conjunction with the accompanying drawings.

DETAILED DESCRIPTION OF THE PREFERRED EMBODIMENT

Figure 1:
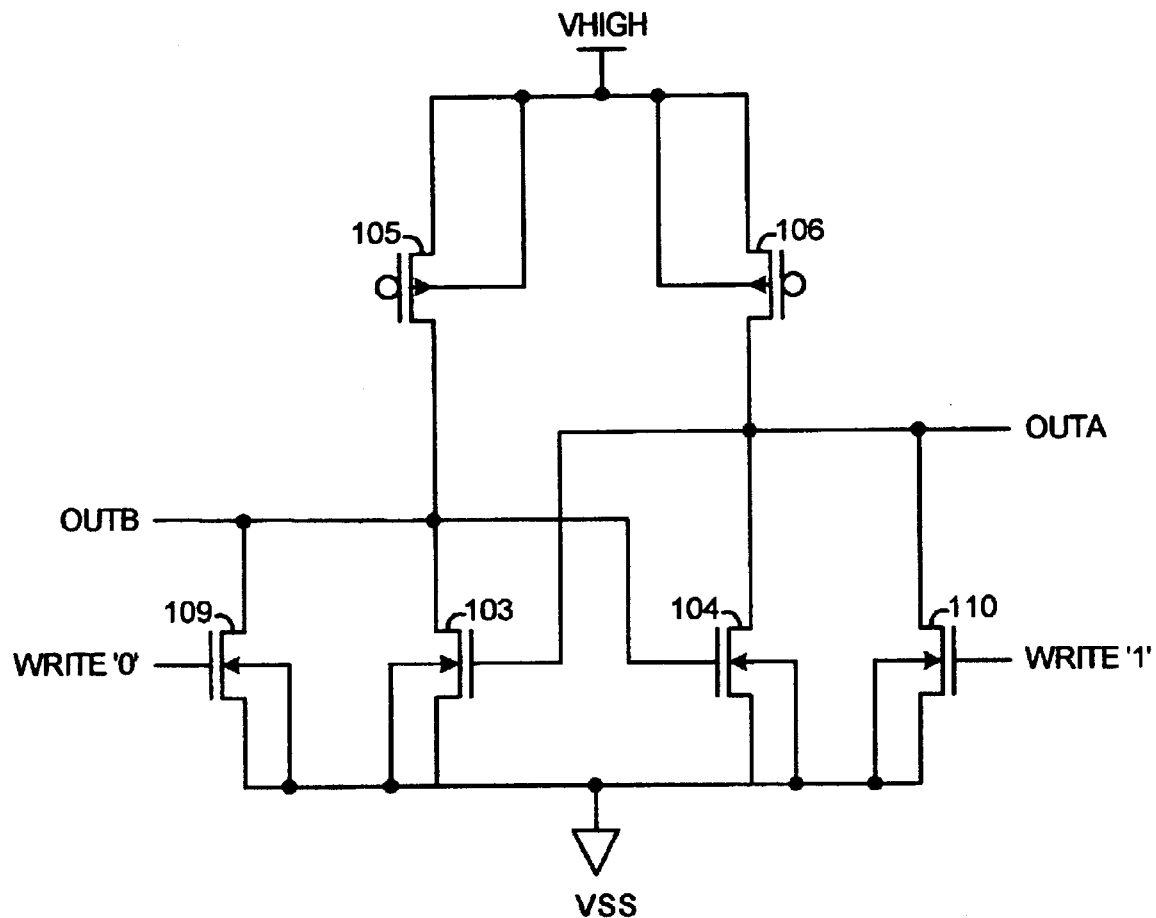
FIG. 1 illustrates, as an example, a first embodiment of an OTP bit cell, utilizing aspects of the present invention.

FIG. 1 illustrates, as an example, a first embodiment of a one-time-programmable ("OTP") bit cell including a latch circuit of cross-coupled inverters. The latch circuit, in this example, includes a first inverter having PMOS floating gate transistor 105 and NMOS transistor 103, and a second inverter having PMOS floating gate transistor 106 and NMOS transistor 104. The inverters are coupled together and to high and low reference voltages, VHIGH and VSS, in conventional fashion to form the latch circuit.

PMOS floating gate transistors 105 and 106 are included and used in the OTP bit cell as OTP elements. Since they are conventionally formed, enhancement mode PMOS transistors with gates simply left unconnected so as not to receive inputs, they are easily manufactured along with NMOS transistors 103 and 104 in a conventional MOS manufacturing process, such as CMOS. In contrast, an EPROM or EEPROM cell would generally require additional manufacturing steps. Also, a separate control gate would also be required for programming the EPROM or EEPROM cell, thus adding to integrated circuit size and cost.

A programming circuit has NMOS transistors 109 and 110 respectively coupled to drains of PMOS floating gate transistors 105 and 106 so as to be able to program one or the other of those devices according to write inputs provided to gates of the NMOS transistors 109 and 110. To select the PMOS floating gate transistor to be programmed, the NMOS transistor (109 or 110) that is coupled to its drain is turned ON while the other NMOS transistor (109 or 110) is turned OFF.

To program the selected PMOS transistor (105 or 106), the high reference voltage VHIGH is then raised to a level such that the voltage across the source and drain of the selected device causes charge to be injected onto its floating gate, thereby altering the threshold voltage of the device so that it is closer to that of a depletion mode transistor instead of an enhancement mode transistor. Because of the different threshold voltages, difference currents flow through the programmed and non-programmed PMOS floating gate transistors, which is then amplified through the latch mechanism when read, so that a differential voltage output across outputs OUTA and OUTB of the latch circuit indicates a logic state that corresponds to the selection and is the same each time when read.

The level that the high reference voltage VHIGH needs to be raised to is preferably determined empirically during device characterization, through a series of finite incremental increases of the high reference voltage VHIGH followed by reading the differential voltage output across outputs OUTA and OUTB of the latch circuit, until the correct logic state results. Generally, this voltage is significantly greater than a high supply voltage VDD. Once the proper voltage level is thus determined, programming of the OTP bit cell is easily performed in the field as well as the factory.

To read the differential voltage output across outputs OUTA and OUTB of the latch circuit, write inputs are provided that turn OFF both of the NMOS transistors 109 and 110 while a read bias voltage is applied at the high reference voltage VHIGH. The read bias voltage in this case is generally less than the high supply voltage VDD to keep from disturbing the PMOS floating gate transistors 105 and 106 during the read operation, and in particular, to avoid soft programming of the non-programmed one of the PMOS floating gate transistors 105 and 106 due to too much voltage being applied across it. Consequently, the output of the latch circuit is not a full swing to the high supply voltage in this case, and another inverter or latch circuit coupled to the high supply voltage VDD is coupled to the differential voltage output to generate a full swing output.

Figure 2:
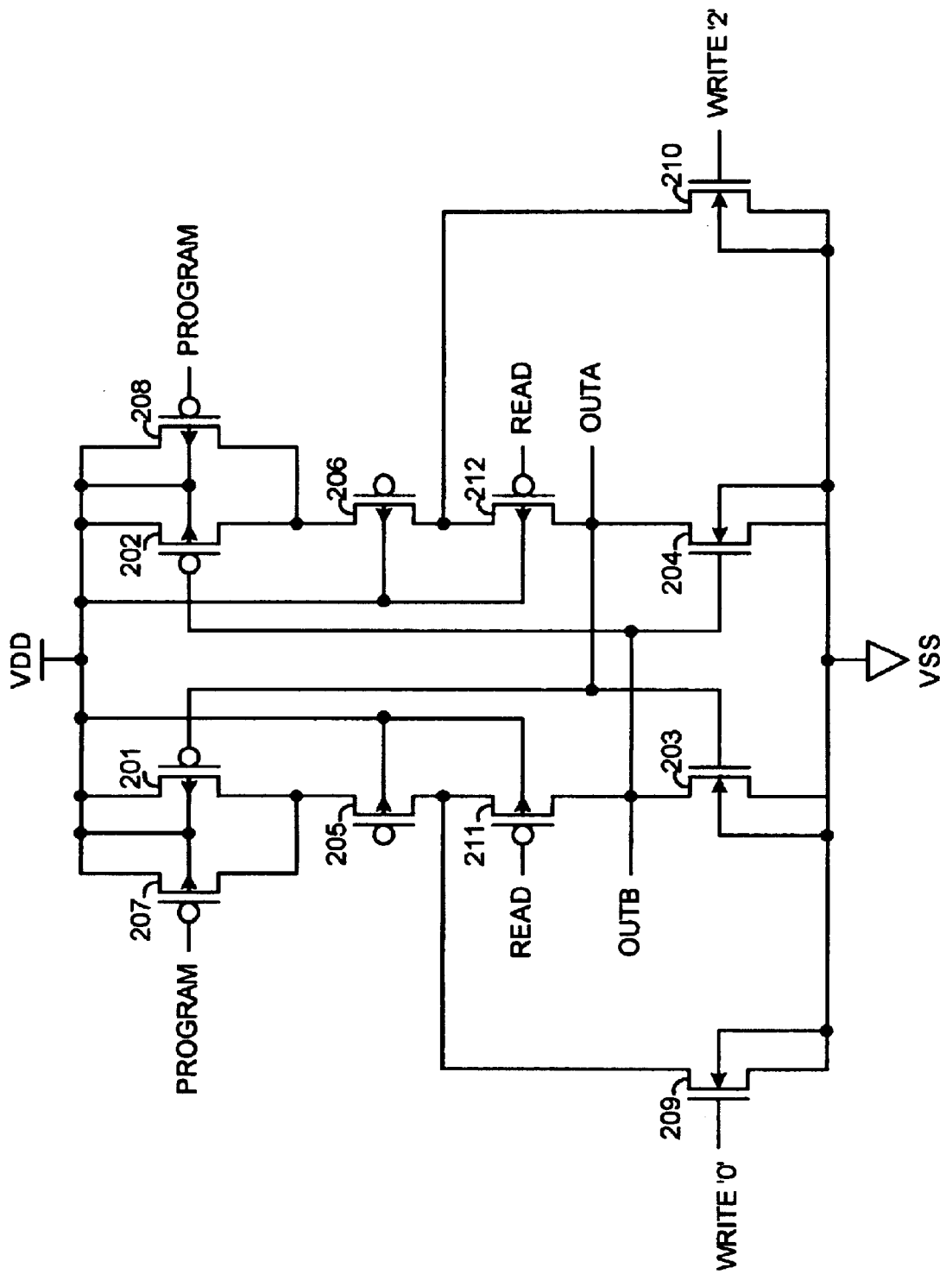
FIG. 2 illustrates, as an example, a second embodiment of an OTP bit cell, utilizing aspects of the present invention.

FIG. 2 illustrates, as an example, a second embodiment of an OTP bit cell including a latch circuit of cross-coupled inverters. A first inverter, in this example, includes PMOS transistor 201 and NMOS transistor 203. A second inverter includes PMOS transistor 202 and NMOS transistor 204. The inverters are coupled together and to a high supply voltage VDD and a low reference voltage VSS in conventional fashion to form the latch circuit.

PMOS floating gate transistors 205 and 206 are included and used in the OTP bit cell as OTP elements. PMOS floating gate transistor 205 is inserted between PMOS transistor 201 and NMOS transistor 203 in the first inverter. Likewise, PMOS floating gate transistor 206 is inserted between PMOS transistor 202 and NMOS transistor 204 in the second inverter. PMOS floating gate transistors 205 and 206 are conventionally formed, enhancement mode PMOS transistors with gates left unconnected so as not to receive inputs. Thus, as in the previous example, they are easily manufactured along with all other transistors in the OTP bit cell, including PMOS transistors 201 and 202 and NMOS transistors 203 and 204, using a conventional MOS manufacturing process, such as CMOS.

A programming circuit has PMOS transistors 207 and 208 that are respectively coupled to PMOS transistors 201 and 202 so as to provide equal current to both PMOS floating gate transistors 205 and 206 during programming mode. The programming circuit also has NMOS transistors 209 and 210 respectively coupled to drains of PMOS floating gate transistors 205 and 206 so as to be able to program one or the other of those devices according to write inputs provided to gates of the NMOS transistors 209 and 210.

To program one of the PMOS floating gate transistors 205 and 206, the voltage across the source and drain of the selected device is increased to a level such that the voltage across the source and drain of the selected device causes charge to be injected onto its floating gate, thereby altering the threshold voltage of the device so that it is closer to that of a depletion mode transistor instead of an enhancement mode transistor. To select the PMOS floating gate transistor to be programmed, the NMOS transistor (209 or 120) that is coupled to its drain is turned ON while the other NMOS transistor (209 or 120) is turned OFF. To program the selected PMOS transistor (205 or 206), the high supply voltage VDD is then raised to an appropriate level while additional current is being provided by PMOS transistors 207 and 208 that are turned ON by applying a programming input PROGRAM in a LOW logic state to their gates. Since the programmed one of the PMOS floating gate transistors 205 and 206 in this case is generally turned ON whenever the device is not being read, the programmed device is therefore pre-charged before it is read. As in the previous example, the appropriate programming voltage level of the high supply voltage VDD may be determined empirically during device characterization.

A read circuit has PMOS transistors 211 and 212 that are individually coupled between a corresponding one of the PMOS floating gate transistors (205 or 206) and output (OUTB or OUTA) of the OTP bit cell, so as to allow reading of a differential voltage across the outputs OUTB and OUTA. To read the differential voltage (OUTB-OUTA), transistors 207~210 of the programming circuit are turned OFF while transistors 211 and 212 of the read circuit are turned ON, so that the programmed PMOS floating gate transistor (205 or 206) passes more current than the non-programmed PMOS floating gate transistor (205 or 206) and as a result, the latch circuit latches a full-swing differential voltage of the desired logic state across the outputs OUTB and OUTA with minimal stress on the non-programmed PMOS floating gate transistors 205 and 206.

The second embodiment of an OTP bit cell described in reference to FIG. 2 requires neither an external read bias nor an attached inverter or latch to generate a full output swing, unlike the first embodiment described in reference to FIG. 1. The external read bias in the second embodiment is not necessary, because the PMOS transistor (201 or 202) that is coupled to the source of the non-programmed one of the PMOS floating gate transistors 205 and 205 serves to effectively disconnect the non-programmed device from the high supply voltage VDD during a read operation. Also, an attached inverter or latch to the differential voltage output of the second embodiment is not necessary, because the latch circuit of the second embodiment already provides a full voltage swing.

Figure 3:
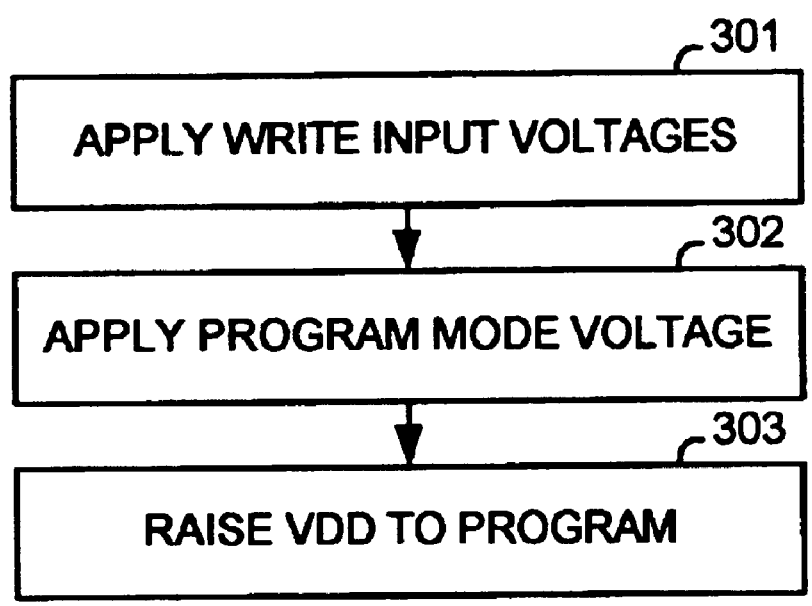
FIG. 3 illustrates, as an example, a flow diagram of a method for programming an OTP bit cell, utilizing aspects of the present invention.

FIG. 3 illustrates, as an example, a flow diagram of a method for programming an OTP bit cell such as that described in reference to FIG. 2. Although described in a sequential manner, it is to be appreciated that 301 and 302 may be interchanged in sequence or performed concurrently. Also, they may be performed before or concurrently with 303.

In 301, write input voltages are applied to gates of NMOS transistors 209 and 210 (i.e., write inputs of WRITE "0" and WRITE "1"). In 302, program mode voltages are applied to gates of PMOS transistors 207 and 208 (i.e., programming input PROGRAM set to a LOW logic state). In 303, the high supply voltage VDD is raised while the program and write input voltages are being applied so as to program one, but not the other of the PMOS floating gate transistors 205 and 206.

In contrast, a flow diagram for a method of programming the OTP bit cell described in reference to FIG. 1 would simply include functions 301 and 303, without reference to program mode voltages. Also, in the case of the first embodiment of the OTP bit cell, it would be proper in 303 to refer to raising the high reference voltage VHIGH, instead of the high supply voltage VDD, to be consistent with its description in reference to FIG. 1, although in practice, the high reference voltage VHIGH may initially be the high supply voltage VDD.

Although the various aspects of the present invention have been described with respect to a preferred embodiment, it will be understood that the invention is entitled to full protection within the full scope of the appended claims.

We claim:

1. An OTP bit cell comprising:

first and second floating gate transistors; and a plurality of transistors coupled to said first and said second floating gate transistors so as to act as a latch circuit such that after one of said first and said second floating gate transistors is programmed by increasing a voltage across its source and drain so as to reduce its threshold voltage, a differential voltage output of said latch circuit results in a logic state corresponding to said programmed one of said first and said second floating gate transistors and is the same each time when read.

2. The OTP bit cell according to claim 1, wherein said first and said second floating gate transistors are PMOS transistors individually having a source, a gate and a drain.

3. The OTP bit cell according to claim 2, wherein said plurality of transistors include first and second NMOS transistors individually having a source, a drain and a gate; said first and said second floating gate transistors sources are coupled to a high reference voltage; said first and said second NMOS transistor sources are coupled to a low reference voltage; said first NMOS transistor gate is coupled to said second floating gate transistor drain, said second NMOS transistor drain, and a first output line of said latch circuit; said second NMOS transistor gate is coupled to said first floating gate transistor drain, said first MMOS transistor drain, and a second output line of said latch circuit; and said differential voltage output is measured across said first and said second output lines of said latch circuit.

4. The OTP bit cell according to claim 1, wherein said plurality of transistors comprises:

first and second PMOS transistors individually having a source, a drain and a gate, wherein said first and said second PMOS transistor sources are coupled to a high supply voltage; and first and second NMOS transistors individually having a source, a drain and a gate, wherein said first and said second NMOS transistor sources are coupled to a low reference voltage, said first NMOS transistor gate is coupled to said first PMOS transistor gate and a first output line of said differential voltage output, and said second NMOS transistor gate is coupled to said second PMOS transistor gate and a second output line of said differential voltage output.

5. The OTP bit cell according to claim 4, wherein said first and said second floating gate transistors are PMOS transistors, wherein said first floating gate transistor is coupled with said first PMOS transistor drain and said first NMOS transistor drain, and said second floating gate transistor is coupled with said second PMOS transistor drain and said second NMOS transistor drain.

6. The OTP bit cell according to claim 5, wherein said first and said second floating gate transistors individually have a source, a drain, and a gate, wherein said first floating gate transistor source is coupled to said first PMOS transistor drain, and said second floating gate transistor source is coupled to said second PMOS transistor drain.

7. The OTP bit cell according to claim 6, further comprising third and fourth PMOS transistors individually having a source, a drain, and a gate, wherein said third PMOS transistor source is coupled to said first floating gate transistor drain, said third PMOS transistor drain is coupled to said first NMOS transistor drain, said fourth PMOS transistor source is coupled to said second floating gate transistor drain, and said fourth PMOS transistor drain is coupled to said second NMOS transistor drain so that said differential voltage output of said latch circuit is generated when a read input coupled to said third and said fourth PMOS transistor gates is activated by going to a low logic state.

8. The OTP bit cell according to claim 6, further comprising:

fifth and sixth PMOS transistors individually having a source, a drain, and a gate, wherein said fifth and sixth PMOS transistor sources are coupled to said high supply voltage, said fifth PMOS transistor drain is coupled to said first PMOS transistor drain, and said sixth PMOS transistor drain is coupled to said second PMOS transistor drain; and third and fourth NMOS transistors individually having a source, a drain, and a gate, wherein said third NMOS transistor drain is coupled to said first floating gate transistor drain, said fourth NMOS transistor drain is coupled to said second floating gate transistor drain, and said third and said fourth NMOS transistor sources are coupled to said low reference voltage so that said one of said first and said second floating gate transistors is programmed when said high supply voltage is increased, a program input coupled to said fifth and said sixth PMOS transistor gates is set to a low logic state, and a first write input coupled to one of said third and said fourth NMOS transistor gates is set to a high logic state while a second write input coupled to the other one of said third and said fourth NMOS transistor gates is set to said low logic state.

9. A method for programming an OTP bit cell including first and second floating gate transistors, first and second PMOS transistors, and first and second NMOS transistors coupled together and to high and low reference voltages so as to form a latch circuit, and third and fourth NMOS transistors coupled to said first and said second floating gate transistors, the method comprising:

applying write input voltages to said third and fourth NMOS transistors while raising said high reference voltage so as to program one, but not the other of said first and said second floating gate transistors.

10. The method according to claim 9, wherein said high reference voltage is a high supply voltage.

11. The method according to claim 10, wherein said OTP bit cell further includes fifth and sixth PMOS transistors coupled to said latch circuit so as to provide additional current through said first and said second floating gate transistors, said method further comprising:

applying program mode voltages to gates of said fifth and sixth PMOS transistors while applying write input voltages to said third and said fourth NMOS transistors and raising said high reference voltage so as to program said one, but not the other of said first and said second floating gate transistors.

* * * * *